(12) United States Patent
Yanagawa

(10) Patent No.: US 6,560,133 B2
(45) Date of Patent: May 6, 2003

(54) CONTENT ADDRESSABLE MEMORY DEVICE WITH ADVANCED PRECHARGE TIMING

(75) Inventor: Miki Yanagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/066,628

(22) Filed: Feb. 6, 2002

(65) Prior Publication Data

US 2002/0176270 A1 Nov. 28, 2002

(30) Foreign Application Priority Data

May 25, 2001 (JP) ........................................ 2001-156911

(51) Int. Cl.[7] .............................................. G11C 15/00
(52) U.S. Cl. ...................... 365/49; 365/203; 365/189.07
(58) Field of Search ..................... 365/49, 203, 189.07, 365/205

(56) References Cited

U.S. PATENT DOCUMENTS 5,715,188 A * 2/1998 Covino et al. ................ 365/49

* cited by examiner

*Primary Examiner*—Huan Hoang
(74) *Attorney, Agent, or Firm*—Arent Fox Kitner Plotkin & Kahn, PLLC

(57) ABSTRACT

A content addressable memory device includes a match line having a potential thereof changed according to whether data of a memory cell matches a search key of a search bus, a precharge circuit which precharges the match line, a sample-&-hold circuit which samples and holds the potential of the match line, and a detection circuit which detects the potential held by the sample-&-hold circuit.

7 Claims, 9 Drawing Sheets

CONTENT ADDRESSABLE MEMORY DEVICE WITH ADVANCED PRECHARGE TIMING

BACKGROUND OF THE INVENTION

1. Field of the Invention

The present invention generally relates to semiconductor memory devices, and particularly relates to a content addressable memory.

2. Description of the Related Art

A Content addressable memory (hereinafter referred to as a CAM) is a memory device that receives data as an input, and outputs an address. A CAM detects data that matches input data within a memory area, and outputs an address at which the matched data is stored. The input data is referred to as an entry key, and the stored data are called entry data.

FIG. 1 is an example of a cell used in a CAM.

A CAM 10 of FIG. 1 includes NMOS transistors 11 through 16 and inverters 17 and 18. The inverters 17 and 18 together form a latch that stores therein one bit data. When the CAM 10 stores "1" therein, the data is latched such that a node N1 and a node N2 are "1" and "0", respectively. When the CAM 10 stores "0" therein, the data is latched such that the node N1 and the node N2 are "0" and "1", respectively. The storing of data is carried out by supplying the data to bit lines BL and /BL and activating a word line WL.

An entry key is provided through a search bus SB and /SB. When the entry key is "1", the search bus lines SB and /SB are "1" and "0", respectively. When the entry key is "0", the search bus lines SB and /SB are "0" and "1", respectively.

In an initial state, a match line ML is precharged to HIGH. An entry key is then supplied to the CAM 10 through the search bus SB and /SB. If a 0/1 data combination of the search bus SB and /SB matches a 0/1 data combination of the entry data stored in the CAM cell 10, the match line ML stays HIGH. If they do not match, the NMOS transistors 11 and 13 simultaneously become conductive, or the NMOS transistors 12 and 14 simultaneously become conductive, so that the match line ML is coupled to the ground to become LOW.

A plurality of CAM cells identical to the CAM cell 10 as described above are provided to store entry data comprised of a plurality of bits, and are connected to the same match line ML in parallel. This provision makes it possible to check a match/mismatch status of an entry key comprised of a plurality of bits.

FIG. 2 is an illustrative drawing showing a configuration in which a plurality of CAM cells 10 are connected to a common match line.

As shown in FIG. 2, a plurality of CAM cells 10 are connected to the same match line ML. If any one of the CAM cells 10 does not match an entry key, i.e., if there is a difference of even a single bit between the entry data and the entry key, the match line ML that has been precharged to HIGH in the initial state is coupled to the ground to be pulled down. If the entry data and the entry key match, the match line ML stays HIGH.

The match line ML is connected to a match line sense amplifier (MLSA) 20 and a match line precharge circuit 21. The match line sense amplifier 20 is mainly comprised of a differential amplifier, and detects the signal level of the match line ML by comparing the potential of the match line ML with a reference potential. The result of detection by the match line sense amplifier 20 is latched by a latch circuit 22 provided at a following stage. The match line precharge circuit 21 precharges the match line ML to a HIGH potential after the data detection by the match line sense amplifier 20 and the latching of data by the latch circuit 22. This completes preparation for a next data search.

FIG. 3 is a drawing showing voltage changes of the match line ML at the time of a data search.

As shown in FIG. 3, when a data search starts by comparing entry data with an entry key, the potential of the match line ML is brought down to the ground potential in the case of a data mismatch. In the case of a data match, however, the potential of the match line ML exhibits almost no change from the precharge potential. After the data detection by the match line precharge circuit 21 and the latching of data by the latch circuit 22, the match line precharge circuit 21 starts a precharge operation. Through this operation, the potential of the match line ML is set to the precharge potential.

In the content addressable memory that operates as described above, the precharging of a match line cannot be carried out until the detection of data by the match line precharge circuit 21 and the latching of data by the latch circuit 22 are completed. Because of this, the speed of a search is limited by the time length required by the detection of data and the latching of data, which makes it difficult to achieve a high-speed search.

Accordingly, there is a need for a content addressable memory that operates at high speed by advancing the timing of a precharge operation.

SUMMARY OF THE INVENTION

It is a general object of the present invention to provide a content addressable memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a content addressable memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a content addressable memory device according to the present invention includes a match line having a potential thereof changed according to whether data of a memory cell matches a search key of a search bus, a precharge circuit which precharges the match line, a sample-&-hold circuit which samples and holds the potential of the match line, and a detection circuit which detects the potential held by the sample-&-hold circuit.

In the content addressable memory device as described above, the potential of the match line is sampled and held by the sample-&-hold circuit, so that the precharge circuit can precharge the match line during the hold operation of the sample-&-hold circuit after an end of the sample operation of the sample-&-hold circuit. Accordingly, the present invention can advance the timing of a precharge operation relative to the related-art precharge timing, thereby increasing the operation speed of the content addressable memory device.

According to another aspect of the present invention, a method of precharging in a content addressable memory device includes the steps of sampling and holding a potential of a match line that changes according to whether data of a memory cell matches a search key of a search bus, detecting the sampled and held potential, and precharging the match line to a predetermined potential concurrently with the detecting of the sampled and held potential.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 4:
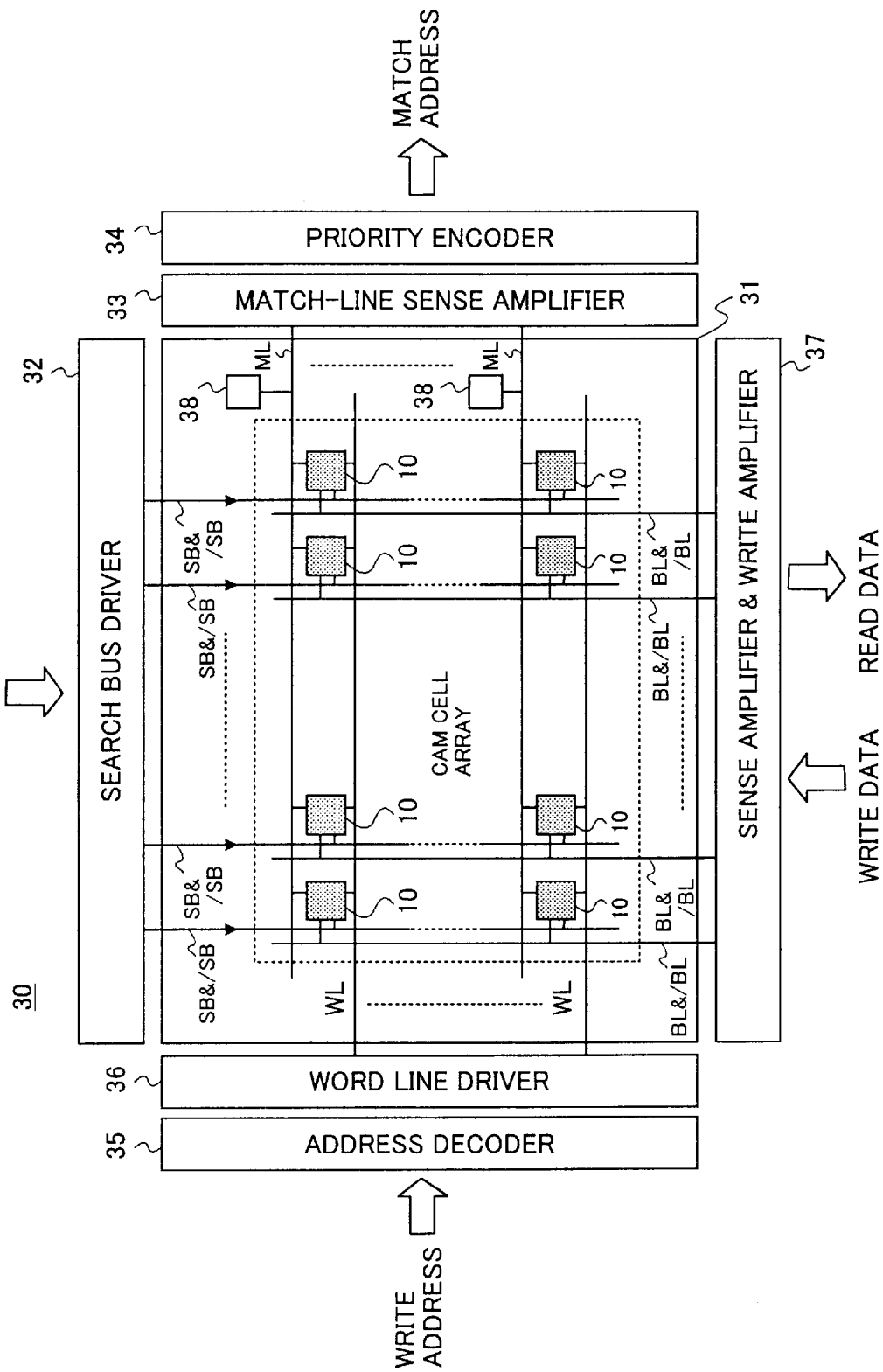
FIG. 4 is a block diagram of a content addressable memory device according to the present invention.

FIG. 4 is a block diagram of a content addressable memory device according to the present invention.

A content addressable memory device 30 of FIG. 4 includes a CAM cell array 31, a search bus driver 32, a match line sense amplifier 33, a priority encoder 34, an address decoder 35, a word line driver 36, and a sense-amplifier-&-write-amplifier unit 37.

Figure 1:
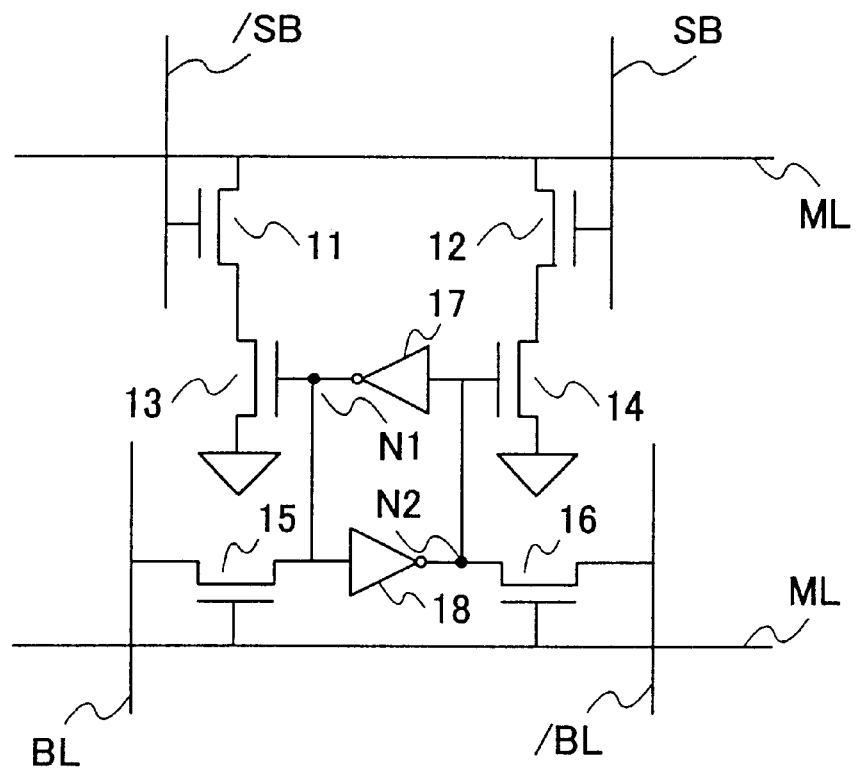
FIG. 1 is an example of a cell used in a CAM.
Figure 2:
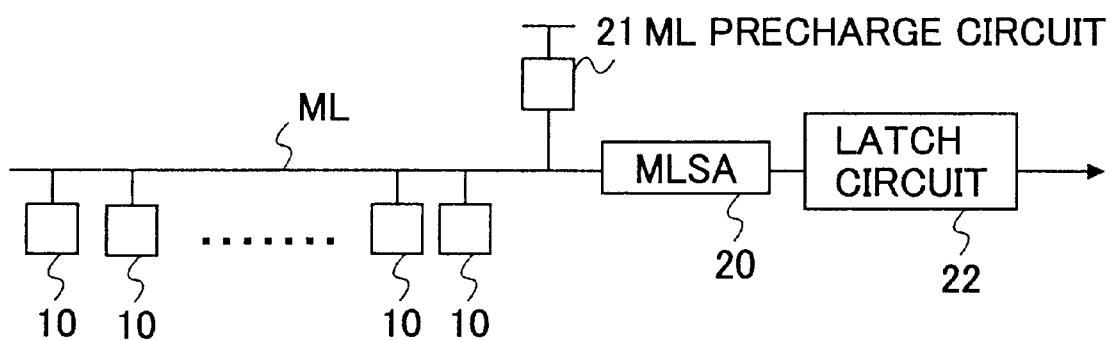
FIG. 2 is an illustrative drawing showing a configuration in which a plurality of CAM cells are connected to a common match line.
Figure 3:
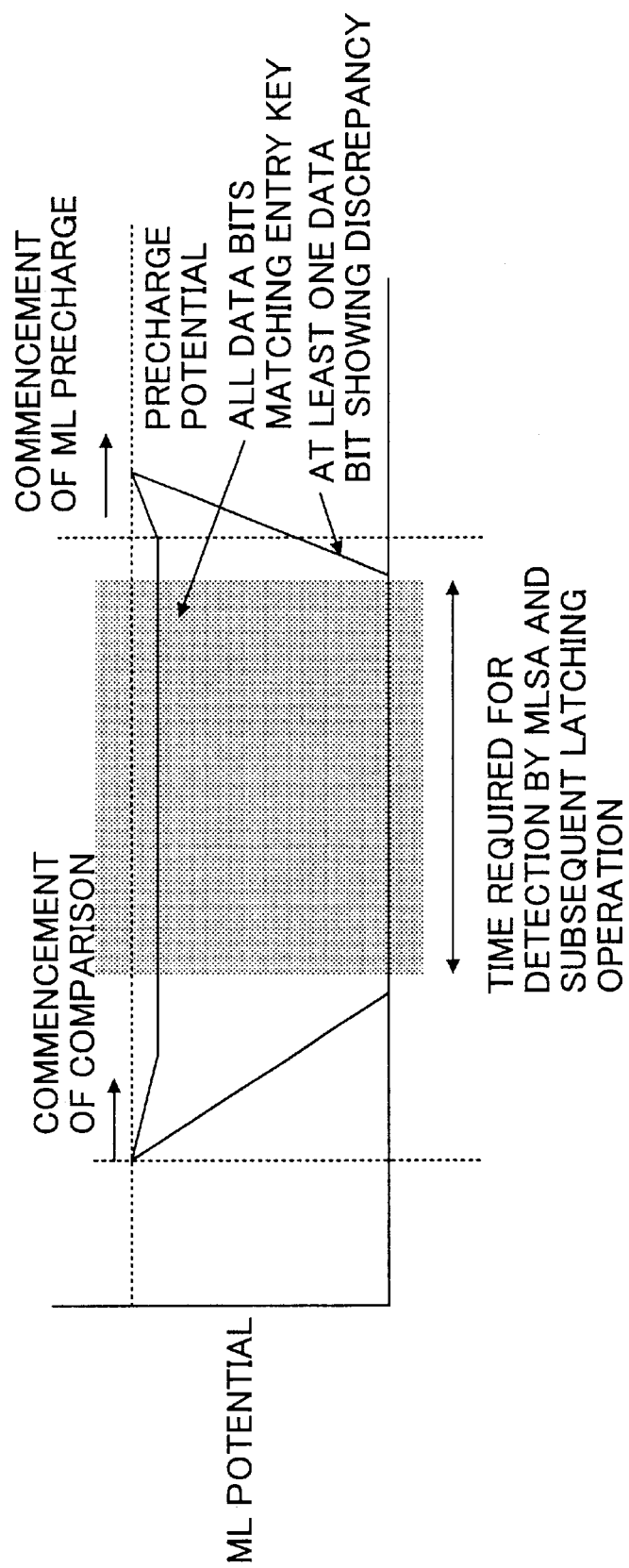
FIG. 3 is a drawing showing voltage changes of a match line at the time of a data search.

The CAM cell array 31 includes a plurality of CAM cells 10 identical to the CAM cell 10 of FIG. 1 arranged in a matrix form. Each of the CAM cells 10 is connected to a word line WL extending from the word line driver 36 and bit lines BL and /BL extending from the sense-amplifier-&-write-amplifier unit 37. A plurality of the CAM cells 10 connected to the same word line WL share the same match line ML, which is connected to the match line sense amplifier 33. The match lines ML are precharged to a predetermined precharge potential by match line precharge circuits 38.

The search bus driver 32 drives search buses SB and /SB according to an entry key entered from an exterior of the device. The entry key supplied through the search buses SB and /SB is compared with entry data stored in the plurality of the CAM cells 10 sharing the same match line ML on a bit-by-bit basis. This comparison is performed separately for each of the lines corresponding to the respective match lines ML. When a data match/mismatch is determined on a match-line-specific basis, the potential of each match line ML changes accordingly. Namely, if the data does not match, the match line ML is pulled down to the ground potential. If the data matches, the match line ML stays at the HIGH potential.

The match line sense amplifier 33 detects and latches the signals of the match lines ML, and supplies the detected and latched signals to the priority encoder 34. The priority encoder 34 encodes addresses corresponding to the matched match lines ML, and supplies the address of the highest priority match data to an exterior of the device.

In ordinary semiconductor memory devices, a data output is uniquely determined with respect to an address input. In a CAM, however, there may be a case in which more than one entry data (stored data) match an entry key (input data), so that the detection of a data match may not be sufficient to uniquely determine a data output. As a precaution against such a situation, the order of priority is determined in advance for each entry data inside the CAM, and the address of the highest priority entry data is output in the event that more than one entry data matches. The priority encoder 34 shown in FIG. 4 is provided for this purpose, and outputs the address of the match line ML corresponding to the smallest address, for example, as the address of the highest priority match data to the exterior of the device if more than one match line ML exhibit a data match.

The address decoder 35 decodes the write address supplied from the exterior of the device, and supplies the decoded results to the word line driver 36. According to the decoded results, the word line driver 36 selectively activates a word line WL that corresponds to the input address. The sense-amplifier-&-write-amplifier unit 37 amplifies the write data supplied from the exterior of the device, and supplies the amplified data to the CAM cell array 31 via the bit lines BL and /BL. The data supplied through the bit lines BL and /BL are stored in the CAM cells 10 connected to the activated word line WL. Data stored in the CAM cells 10 can be read from the CAM cell array 31 in the same manner as in a read operation of an ordinary memory device, followed by being amplified by the sense-amplifier-&-write-amplifier unit 37 to be output to the exterior of the device.

Figure 5:
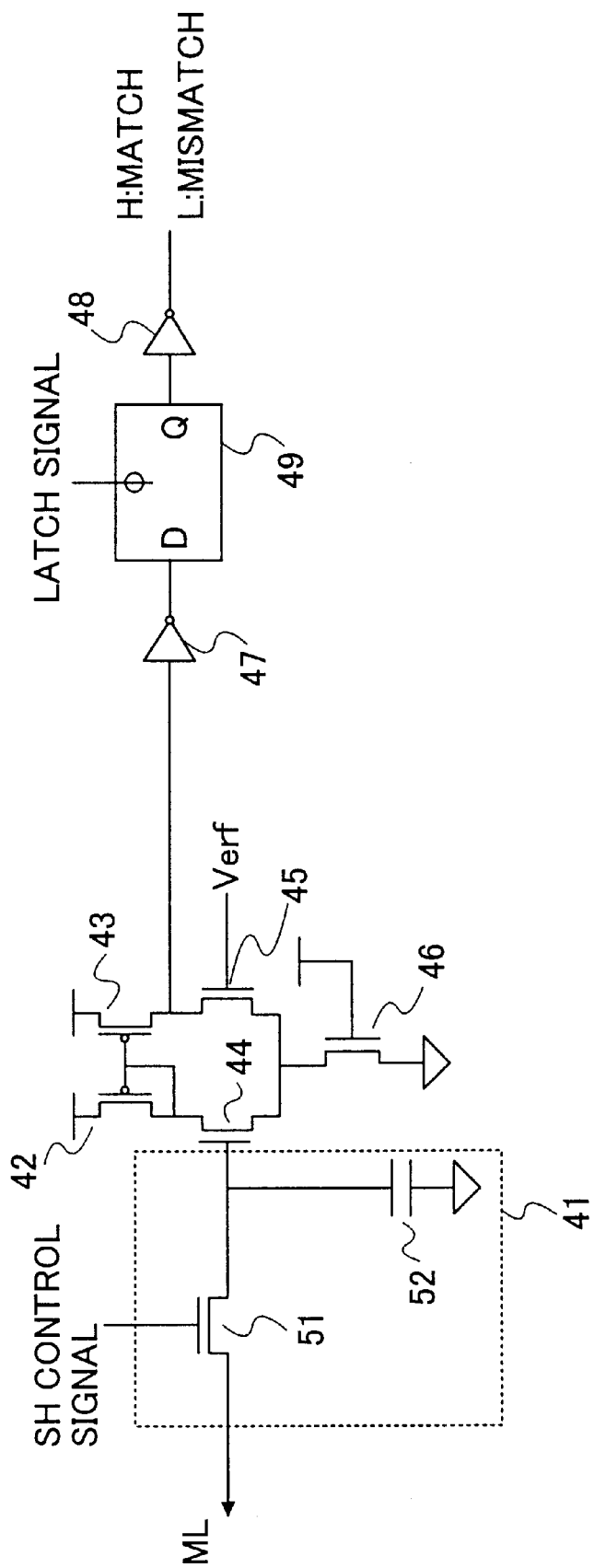
FIG. 5 is a circuit diagram of a match line sense amplifier according to a first embodiment of the present invention.

FIG. 5 is a circuit diagram of the match line sense amplifier 33 according to a first embodiment of the present invention.

FIG. 5 shows a partial circuit configuration of the match line sense amplifier 33 that corresponds to a single match line ML. The circuit of FIG. 5 includes a sample-&-hold circuit 41, PMOS transistors 42 and 43, NMOS transistors 44 through 46, inverters 47 and 48, and a latch circuit 49. The sample-&-hold circuit 41 includes an NMOS transistor 51 and a capacitor 52. The PMOS transistors 42 and 43 and the NMOS transistors 44 through 46 together form a current mirror amplifier, and detects the signal of the match line ML by comparing it with a reference potential Vref. In the description that follows, the latch circuit 49 is described as being part of the match line sense amplifier 33. However, the latch function may be provided in the priority encoder 34, for example, rather than in the match line sense amplifier 33, and it does not matter where such a latch function is located as long as the latch function is provided at a stage following the sense amplifier function to latch the amplifier output.

The sample-&-hold circuit 41 is provided between the match line ML and the amplifier, and holds the signal level of the match line ML at a sample timing indicated by an SH control signal. In detail, electric charge corresponding to the signal level of the match line ML is stored in the capacitor 52 at the timing at which the SH control signal that is input to the gate of the NMOS transistor 51 is HIGH. In this manner, the gate potential of the NMOS transistor 44 input to the amplifier is held equal to the sampled potential of the match line ML by the capacitor 52.

Figure 6:
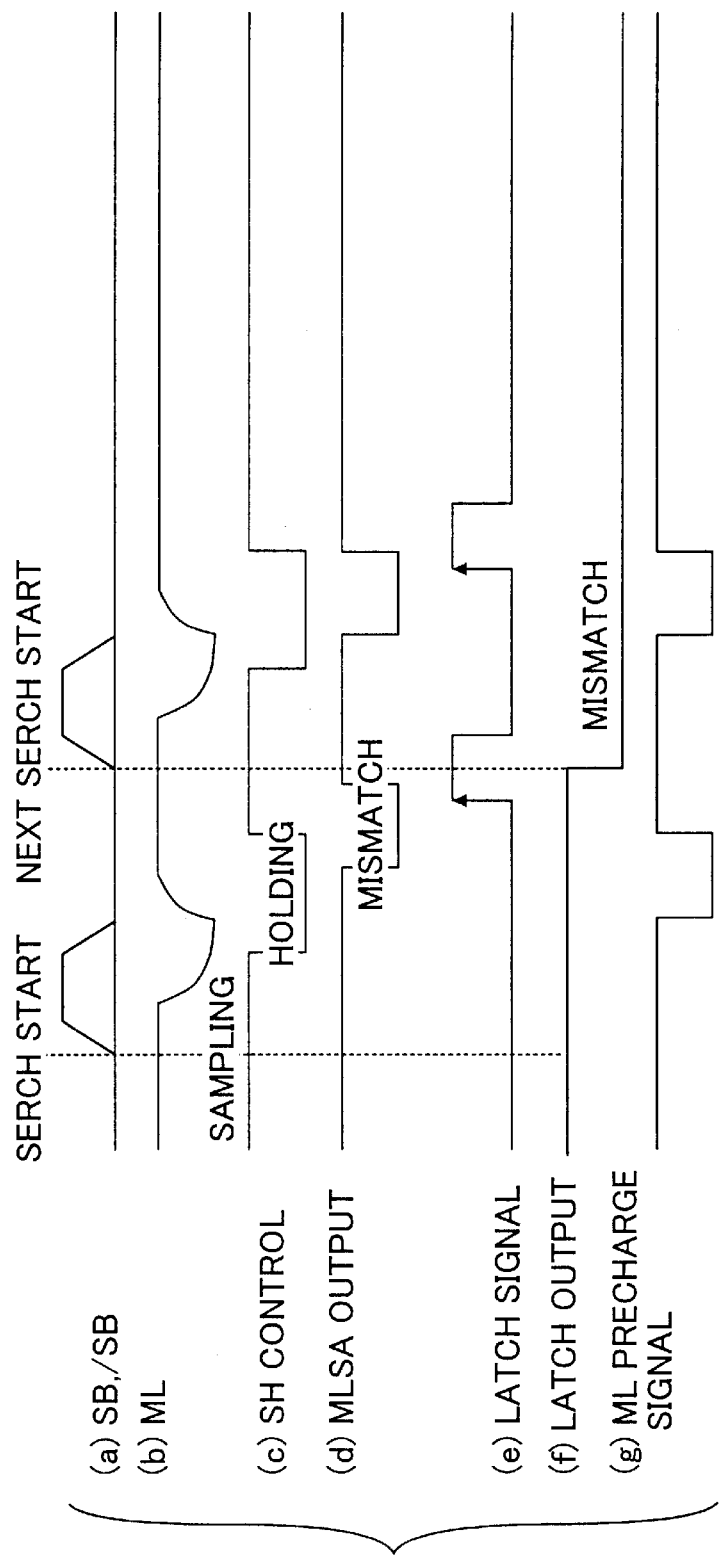
FIG. 6 is a signal waveform diagram showing operations of the circuit of FIG. 5.

FIG. 6 is a signal waveform diagram showing operations of the circuit of FIG. 5.

In FIG. 6, a letter designation (a) indicates a data waveform (entry key) of the search bus SB and /SB, and a letter designation (b) shows a signal waveform of a match line ML. A letter designation (c) illustrates an example of the SH control signal, and (d) demonstrates the output of the amplifier. Further, a letter designation (e) indicates an example of a latch signal that prompts a latch operation of the latch circuit 49. A letter designation (f) shows a data output of the latch circuit 49, and (g) is an ML precharge signal that precharges the match lines ML. This precharge signal prompts the match line precharge circuits 38 shown in FIG. 4 to precharge the match lines ML.

As shown in FIG. 6, the search buses SB and /SB are driven as the search starts, resulting in an entry key appearing on the buses. If the entry key and entry data are not the same, the potential of the match line ML is brought down toward the ground potential from the precharge potential. When the potential of the match line ML settles, i.e., when the potential of the match line ML has gone down sufficiently in response to a data mismatch, the SH control circuit stops the sampling operation of the sample-&-hold circuit 41. The potential of the match line ML sampled and held by the sample-&-hold circuit 41 is compared by the amplifier shown in FIG. 5 with the reference potential Vref. The compared and detected result appears as an output of the amplifier as shown in FIG. 6-(d). The output of the amplifier is latched by the latch circuit 49 at a rising edge of the latch signal, for example, as shown in FIG. 6-(e) and (f).

As shown in FIG. 6-(g), the ML precharge signal (initiates precharge by a LOW pulse thereof) prompts a precharge operation prior to the latching by the latch signal and prior to the detection of a potential by the amplifier. As a result, the match line ML is precharged to a precharge potential as shown in FIG. 6-(b). At this point of time, the potential of the match line ML has been already held by the sample-&-hold circuit 41, and the potential held by the sample-&-hold circuit 41 does not change even when the match line ML is precharged. This potential held by the sample-&-hold circuit 41 is detected and latched as described above independently of the precharge operation of the match line ML. Accordingly, the present invention can advance the timing of a precharge operation relative to the precharge timing of the related-art configuration, thereby increasing an operation speed of the content addressable memory device.

Figure 7:
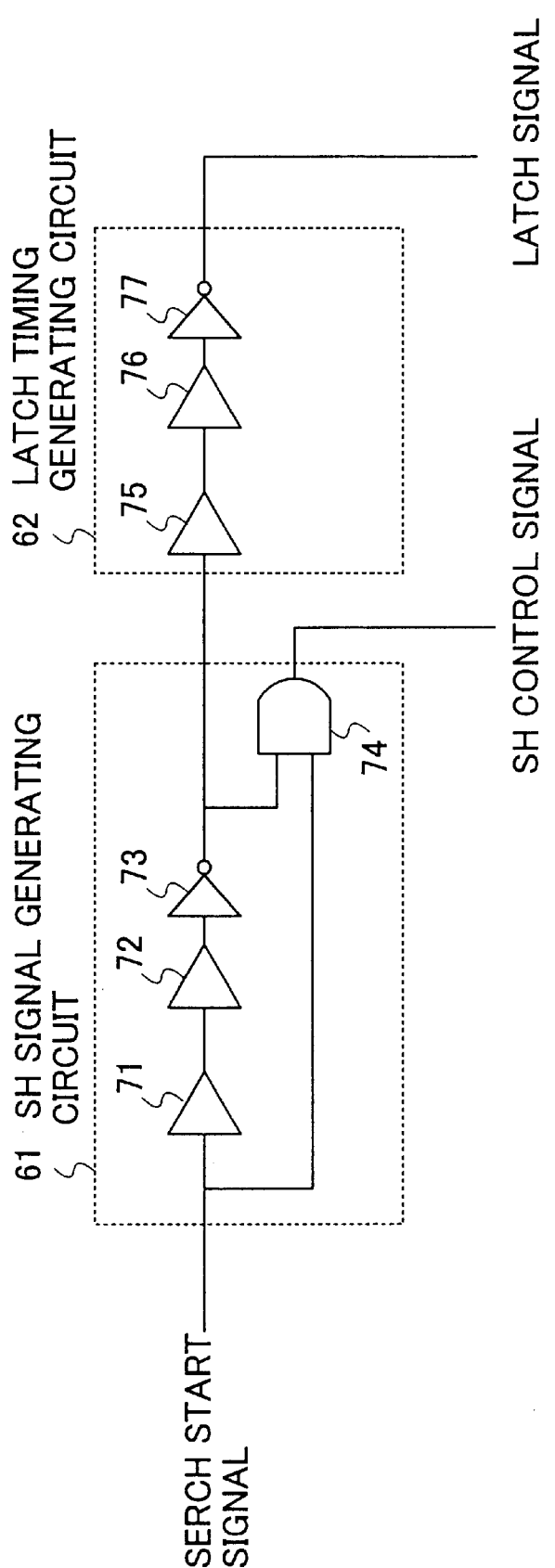
FIG. 7 is a circuit diagram showing an example of a circuit that generates an SH control signal and a latch signal.
Figure 8:
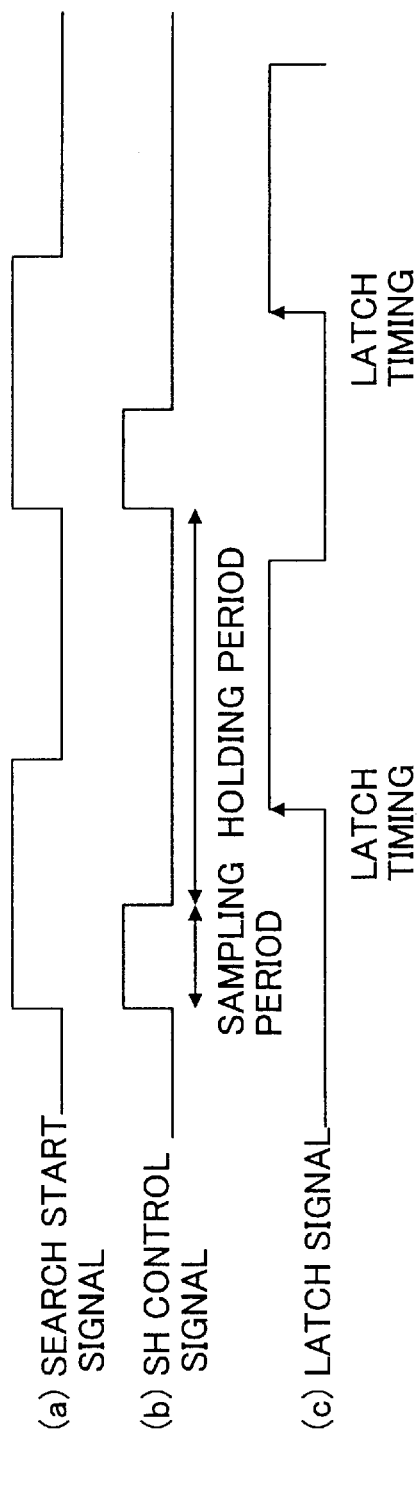
FIG. 8 is a signal waveform diagram showing a search start signal and further showing the SH control signal and the latch signal generated from the search start signal.

FIG. 7 is a circuit diagram showing an example of a circuit that generates the SH control signal and the latch signal. FIG. 8 is a signal waveform diagram showing a search start signal and further showing the SH control signal and the latch signal generated from the search start signal.

The circuit of FIG. 7 includes an SH signal generating circuit 61 and a latch timing generating circuit 62. In this example, this circuit generates the SH control signal and the latch signal by using the search start signal as a point of reference that marks the start of a data search operation in a CAM. The SH signal generating circuit 61 includes buffers 71 and 72, an inverter 73, and an AND circuit 74. The latch timing generating circuit 62 includes buffers 75 and 76 and an inverter 77.

In the SH signal generating circuit 61, the search start signal is supplied to one input of the AND circuit 74. Further, the search start signal is supplied to another input of the AND circuit 74 through the buffers 71 and 72 and the inverter 73. When the search start signal becomes HIGH, the SH control signal output from the AND circuit 74 becomes HIGH. The change to HIGH of the search start signal appears as a change to LOW of the output of the inverter 73 after the passage of a predetermined delay time that is determined by the buffers 71 and 72 and the inverter 73. As the output of the inverter 73 changes to LOW, the SH control signal that is output from the AND circuit 74 turns to LOW. As a result, the SH control signal becomes HIGH as the search start signal changes to HIGH, and returns to LOW after the passage of the predetermined time period.

The output of the inverter 73 that prompts the change to LOW of the SH control signal is supplied to the latch timing generating circuit 62, in which the SH control signal is delayed by the buffers 75 and 76 and the inverter 77, followed by being output as a latch signal. Accordingly, the latch signal is derived by delaying the search start signal, and exhibits a rise at an end of a predetermined time period after the change to LOW of the SH control signal.

Use of the SH control signal and the latch signal generated as described above for controlling of the sample-&-hold circuit 41 and the latch circuit 49 makes it possible to sample, hold, and latch data at appropriate timings.

Figure 9:
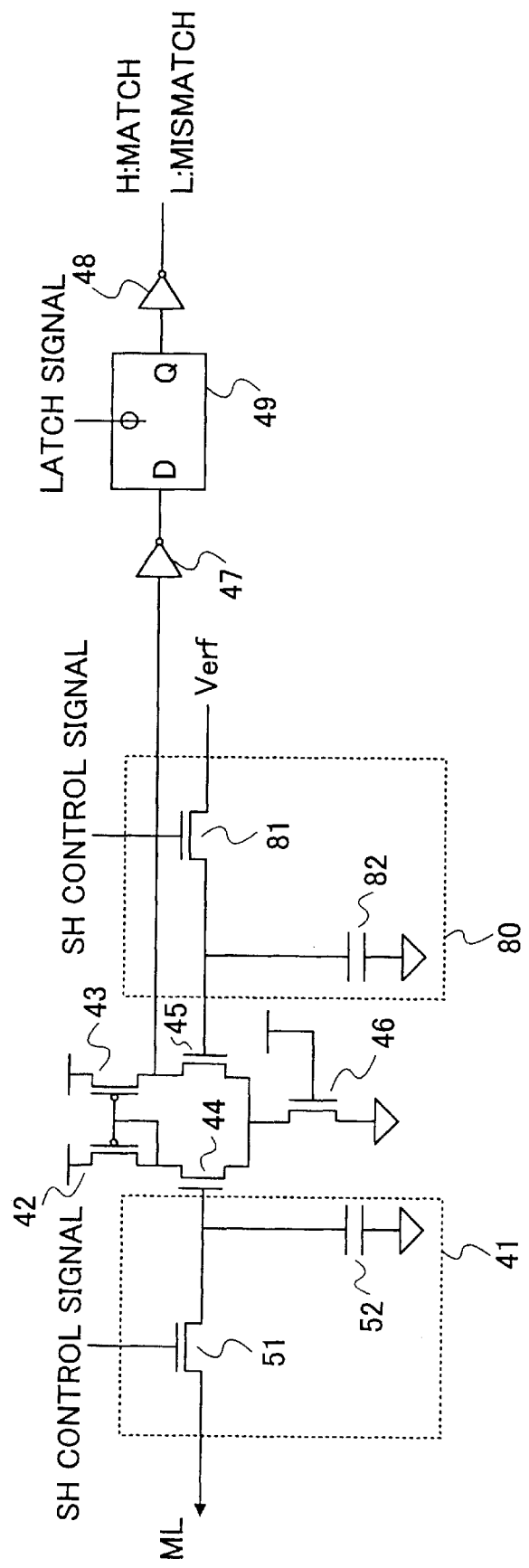
FIG. 9 is a circuit diagram of the match line sense amplifier according to a second embodiment of the present invention.

FIG. 9 is a circuit diagram of the match line sense amplifier 33 according to a second embodiment of the present invention. In FIG. 9, the same elements as those of FIG. 5 are referred to by the same numerals, and a description thereof will be omitted.

FIG. 9 shows only a portion of the match line sense amplifier 33 that corresponds to a single match line ML. The circuit of FIG. 9 is newly provided with a sample-&-hold circuit 80 for holding the reference potential Vref in addition to the configuration of the first embodiment shown in FIG. 5. The sample-&-hold circuit 80 includes an NMOS transistor 81 and a capacitor 82. The gate of the NMOS transistor 81 of the sample-&-hold circuit 80 receives the same SH control signal that is supplied to the sample-&-hold circuit 41. With this provision, the sample-&-hold circuit 80 samples and holds the reference potential Vref at the same timing through the same mechanism as when the sample-&-hold circuit 41 samples and holds the potential of the match line ML.

In the configuration of the first embodiment in which only the sample-&-hold circuit 41 is provided for the match line ML as shown in FIG. 5, the potential held by the capacitor 52 may undesirably drop due to an effect of coupling capacitance between the gate and the source or between the gate and the drain as the gate of the NMOS transistor 51 of the sample-&-hold circuit 41 is brought down to the ground potential after the completion of a sampling operation. In this case, a drop in the sampled potential may function as noise, thereby causing erroneous detection of data. In the second embodiment configuration as shown in FIG. 9, on the other hand, the sample-&-hold circuit 80 is provided also for the reference potential Vref, thereby creating a noise on the side of the reference potential Vref that is equivalent to the noise generated by the sample and hold operation on the side of the match line ML. This cancels the noises when the current mirror amplifier compares the sampled potential of the match line ML with the sampled potential of the reference potential Vref for the purpose of detecting the potential level, thereby improving the accuracy of potential detection.

Figure 10:
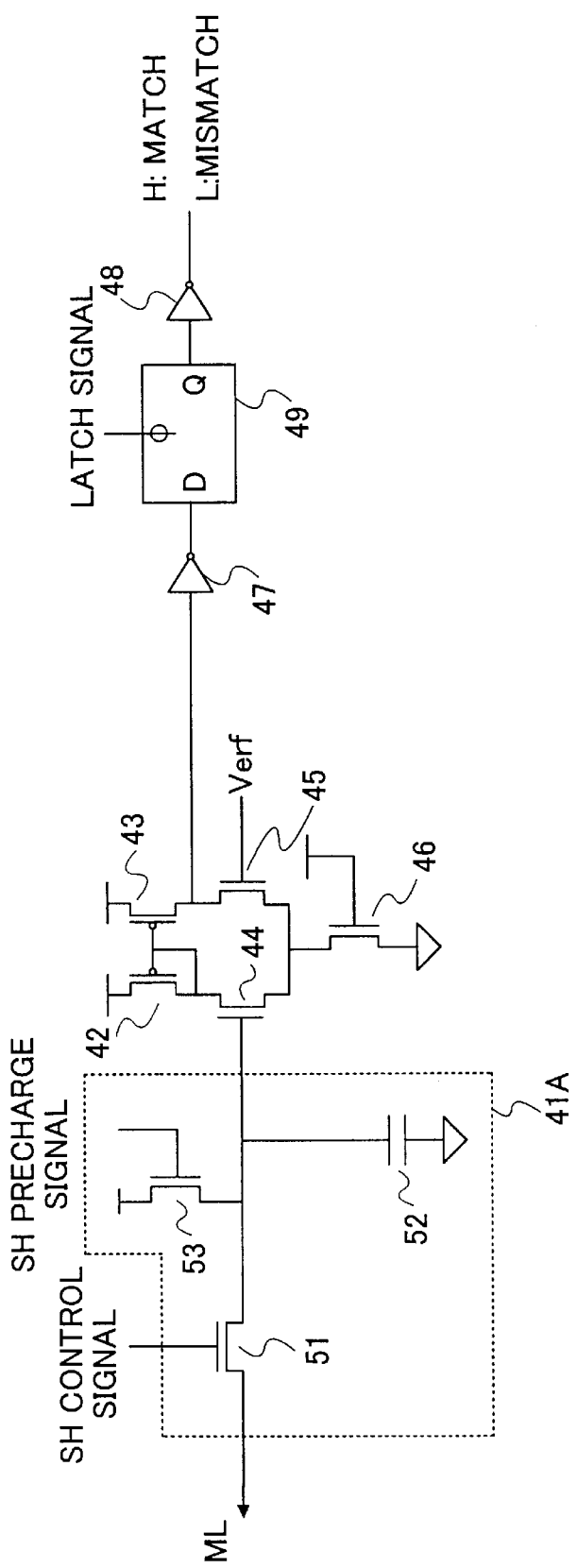
FIG. 10 is a circuit diagram of the match line sense amplifier according to a third embodiment of the present invention.

FIG. 10 is a circuit diagram of the match line sense amplifier 33 according to a third embodiment of the present invention. In FIG. 10, the same elements as those of FIG. 5 are referred to by the same numerals, and a description thereof will be omitted.

FIG. 10 shows only a portion of the match line sense amplifier 33 that corresponds to a single match line ML. The configuration of FIG. 10 differs from the first embodiment configuration of FIG. 5 in that the sample-&-hold circuit 41 is replaced by a sample-&-hold circuit 41A. The sample-&-hold circuit 41A includes a precharge-purpose NMOS transistor 53 in addition to the NMOS transistor 51 and the capacitor 52. The gate of the precharge-purpose NMOS transistor 53 receives an SH precharge signal for the purpose of precharging the sample-&-hold circuit 41A. When this SH precharge signal becomes HIGH, the NMOS transistor 53 becomes conductive, thereby precharging the capacitor 52 to the same precharge potential as that of the match line ML.

The first embodiment of FIG. 5 is not provided with a precharge function for precharging a sample-&-hold circuit as shown in FIG. 10. In such a configuration as that of the first embodiment, when the NMOS transistor 51 becomes conductive after the precharging of the match line ML, the potential of the match line ML drops due to the capacitance of the capacitor 52 if the potential held by the sample-&-hold circuit on the previous cycle is LOW. This may adversely affect the subsequent detection of a potential. In consideration of this, the third embodiment shown in FIG. 10 provides the precharge function for the sample-&-hold circuit, thereby precharging the capacitor 52 before it is coupled to the match line ML. This makes it possible to avoid dropping of the match line potential below the precharge level at the time when the sample-&-hold circuit 41A starts a sampling operation. The detection of a potential of the match line ML thus becomes more accurate.

Further, the present invention is not limited to these embodiments, but various variations and modifications may be made without departing from the scope of the present invention.

The present application is based on Japanese priority application No. 2001-156911 filed on May 25, 2001, with the Japanese Patent Office, the entire contents of which are hereby incorporated by reference.

What is claimed is:

1. A content addressable memory device, comprising:
a match line having a potential thereof changed according to whether data of a memory cell matches a search key of a search bus;
a precharge circuit which precharges said match line;
a sample-&-hold circuit which samples and holds the potential of said match line; and
a detection circuit which detects the potential held by said sample-&-hold circuit.

2. The content addressable memory device as claimed in claim 1, wherein said precharge circuit precharges said match line while said sample-&-hold circuit holds the potential of said match line after the sampling operation of the sample-&-hold circuit.

3. The content addressable memory device as claimed in claim 1, further includes another sample-&-hold circuit which samples and holds a reference potential, wherein said detection circuit detects the potential of said match line held by said sample-&-hold circuit through comparison with the reference potential held by said another sample-&-hold-circuit.

4. The content addressable memory device as claimed in claim 1, wherein said sample-&-hold circuit includes:
a capacitor; and
a switch circuit which controls a connection between said capacitor and said match line.

5. The content addressable memory device as claimed in claim 4, wherein said sample-&-hold circuit further includes a precharge circuit for precharging said capacitor.

6. A method of precharging in a content addressable memory device, comprising the steps of:
sampling and holding a potential of a match line that changes according to whether data of a memory cell matches a search key of a search bus;
detecting the sampled and held potential; and
precharging the match line to a predetermined potential concurrently with the detecting of the sampled and held potential.

7. The method of precharging in a content addressable memory device as claimed in claim 6, wherein said step of detecting the sampled and held potential includes:
sampling and holding a reference potential; and
comparing the sampled and held reference potential with the sampled and held potential of the match line.

* * * * *